United States Patent
Liu et al.

(10) Patent No.: US 11,015,052 B2
(45) Date of Patent: May 25, 2021

(54) HALOGEN-FREE LOW DIELECTRIC RESIN COMPOSITION, AND PREPREG, METAL-CLAD LAMINATE, AND PRINTED CIRCUIT BOARD PREPARED USING THE SAME

(71) Applicant: TAIWAN UNION TECHNOLOGY CORPORATION, Chupei (TW)

(72) Inventors: Shur-Fen Liu, Chupei (TW); Chin-Hsien Hung, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 105 days.

(21) Appl. No.: 16/277,069

(22) Filed: Feb. 15, 2019

(65) Prior Publication Data
US 2020/0181402 A1 Jun. 11, 2020

(30) Foreign Application Priority Data
Dec. 6, 2018 (TW) .................. 107143979

(51) Int. Cl.
| | |
|---|---|
| C08L 71/12 | (2006.01) |
| C08L 47/00 | (2006.01) |
| C08L 25/02 | (2006.01) |
| C08J 5/24 | (2006.01) |
| H05K 1/03 | (2006.01) |
| B32B 15/14 | (2006.01) |

(52) U.S. Cl.
CPC .............. *C08L 71/12* (2013.01); *B32B 15/14* (2013.01); *C08J 5/24* (2013.01); *C08L 25/02* (2013.01); *C08L 47/00* (2013.01); *H05K 1/0373* (2013.01); *B32B 2260/046* (2013.01); *B32B 2457/08* (2013.01); *C08J 2325/02* (2013.01); *C08J 2347/00* (2013.01); *C08J 2371/12* (2013.01); *C08J 2425/02* (2013.01); *C08J 2447/00* (2013.01); *C08J 2471/12* (2013.01); *C08L 2201/08* (2013.01); *C08L 2203/20* (2013.01); *C08L 2205/025* (2013.01); *C08L 2205/03* (2013.01); *C08L 2312/02* (2013.01)

(58) Field of Classification Search
CPC combination set(s) only.
See application file for complete search history.

(56) References Cited

U.S. PATENT DOCUMENTS

| | | | |
|---|---|---|---|
| 5,218,030 A | 6/1993 | Katayose et al. |
| 5,352,745 A | 10/1994 | Katayose et al. |
| 6,352,782 B2 | 3/2002 | Yeager et al. |
| 6,518,336 B1 | 2/2003 | Yabuhara et al. |
| 6,524,717 B1 | 2/2003 | Takano et al. |
| 6,528,559 B1 | 3/2003 | Nakacho et al. |
| 6,743,841 B2 | 6/2004 | Shimizu et al. |
| 6,995,195 B2 | 2/2006 | Ishii et al. |
| 2007/0129502 A1† | 6/2007 | Kawabe |
| 2011/0130497 A1 | 6/2011 | Su et al. |
| 2016/0145370 A1 | 5/2016 | Kitai et al. |
| 2016/0280913 A1 | 9/2016 | Liu et al. |
| 2017/0260367 A1 | 9/2017 | Liu et al. |
| 2018/0155376 A1† | 6/2018 | Hayashi |

FOREIGN PATENT DOCUMENTS

| | | |
|---|---|---|
| CN | 105358595 B | 12/2017 |
| TW | 445276 B | 7/2001 |
| TW | 201731937 A | 9/2017 |
| TW | 201736413 A | 10/2017 |

OTHER PUBLICATIONS

Machine translation of TW 201736413A (Year: 2017).*

\* cited by examiner
† cited by third party

*Primary Examiner* — Ramsey Zacharia
(74) *Attorney, Agent, or Firm* — Michael W. Ferrell; Ferrells, PLLC; Anna Kinney

(57) ABSTRACT

A halogen-free low dielectric resin composition is provided. The halogen-free low dielectric resin composition comprises:
(A) a resin system, which includes:
  (a1) a polyphenylene ether resin with unsaturated functional groups, and
  (a2) a polyfunctional vinyl aromatic copolymer; and
(B) an allyl cyclophosphazene compound represented by the following formula (I):

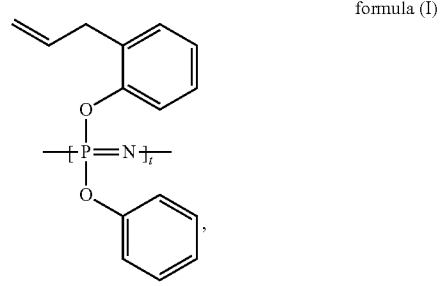

formula (I)

in formula (I), t is an integer ranging from 2 to 6, wherein, the polyfunctional vinyl aromatic copolymer (a2) is prepared by copolymerizing one or more divinyl aromatic compounds and one or more monovinyl aromatic compounds.

16 Claims, No Drawings

HALOGEN-FREE LOW DIELECTRIC RESIN COMPOSITION, AND PREPREG, METAL-CLAD LAMINATE, AND PRINTED CIRCUIT BOARD PREPARED USING THE SAME

CLAIM FOR PRIORITY

This application claims the benefit of Taiwan Patent Application No. 107143979 filed on Dec. 6, 2018, the subject matters of which are incorporated herein in their entirety by reference.

BACKGROUND OF THE INVENTION

Field of the Invention

The present invention provides a halogen-free low dielectric resin composition, especially a polyphenylene ether resin composition for halogen-free electronic materials with the following advantages: a low dielectric constant (Dk), a low dissipation factor (DO, a high adhesion to copper foils and an excellent moldability. The halogen-free low dielectric resin composition of the present invention can be used in combination with reinforced materials to constitute a composite material or prepreg. Furthermore, it can be used as a metal foil adhesive to manufacture a resin-coated copper (RCC), a metal-clad laminate, a printed circuit board (PCB) etc.

Descriptions of the Related Art

Recently, in the field of electronic telecommunications, electronic products have been designed to operate at higher frequencies and speeds due to the need for increasing amount of data transmission; therefore, the dielectric properties of the related electronic materials need to be enhanced. In consideration of the trends of high-frequency and high-speed signal transmission, miniaturization of electronic elements, and high-density wiring of PCBs, there is a big need for electronic materials with low dielectric properties. However, conventional electronic materials obtained from a resin composition comprising an epoxy resin as the main component are currently failing to meet this need. The resin composition comprising the epoxy resin as the main component, which is conventionally used to prepare electronic materials, is now being replaced by a resin composition comprising a polyphenylene ether resin as the main component.

Furthermore, due to growing environmental awareness, halogen-containing flame retardants are gradually being replaced by halogen-free flame retardants, such as metal hydroxides, nitrogen-containing compounds, phosphorus-containing compounds, etc. However, when using conventional halogen-free flame retardants in a resin composition, the dielectric properties of the prepared electronic materials usually degrade. For example, the prepared electronic materials usually have higher Dk values or Df values. Although the formulation of the resin composition is adjusted to optimize the dielectric properties of the electronic materials, the physicochemical properties and mechanical properties of the electronic materials may often compromise. For example, the adhesion to copper foils, dimensional stability, heat resistance and moldability (fluidity) may degrade.

U.S. Pat. No. 6,352,782 B2 discloses a thermosetting resin composition comprising a polyphenylene ether resin modified by unsaturated functional groups at the terminals and crosslinkable unsaturated monomer compounds. In U.S. Pat. No. 6,352,782 B2, triallyl isocyanurate (TAIC) is used as the unsaturated monomer compound, which is combined with the acrylate group-modified polyphenylene ether resin to form a thermosetting resin composition useful for making electronic materials with good high frequency electrical properties and heat resistance. However, due to the low reactivity of the allyl groups contained in TAIC, a large amount of radical initiators should be added to the thermosetting resin composition to achieve the desired reactivity. In addition, TAIC at extremely high frequencies has higher Df values, thus, electronic materials produced from the thermosetting resin composition are not suitable for application involving extremely high frequencies.

CN 105358595 B discloses a thermosetting resin composition useful for preparing electronic materials applied in high frequencies ranging from megahertz (MHz) to gigahertz (GHz). The thermosetting resin composition comprises a polyphenylene ether resin modified by unsaturated functional groups at the terminals and a crosslinking agent with unsaturated functional groups, wherein the said crosslinking agent with unsaturated functional groups include divinyl benzene (DVB) and polybutadiene. In CN 105358595 B, the normally used TAIC is replaced by DVB as a crosslinking agent to improve the reactivity of the thermosetting resin composition and the varnish shelf life. However, DVB has high volatility and an irritating odor, and when the thermosetting resin composition is used for preparing a prepreg, during the baking process, a portion of DVB is apt to volatilize out of the thermosetting resin composition and dissipate, thereby unbalancing the ratio between the components in the thermosetting resin composition and adversely affecting the physicochemical properties of the electronic materials produced therefrom.

TW 201736413 A discloses a polyfunctional vinyl aromatic copolymer and curable compositions comprising it, wherein a copolymer or oligomer of DVB is formed to increase its molecular weight and boiling point, thus, overcoming the problem that DVB is apt to volatilize and has an irritating odor at high temperatures, thereby obtaining electronic materials with low dielectric properties. However, TW 201736413 A only describes that a bromine-containing flame retardant, such as decabromodiphenyl ethane or brominated polystyrene, can be used as a flame retardant in a curable composition to provide flame retardance, but how to produce electronic materials with flame retardance, low Dk value, low Df value, high adhesion to copper foils, high heat resistance and excellent moldability, without using halogen-containing substances, is not discussed.

Therefore, there is a need for a halogen-free electronic material for use at high frequencies which has low Dk and Df values, and also has satisfactory adhesion to copper foils, heat resistance, moldability, etc.

SUMMARY OF THE INVENTION

The problem to be solved by the present invention is that conventional DVB-containing polyphenylene ether resin composition cannot simultaneously meet the halogen-free and flame retardance requirements. To this end, the present invention provides a halogen-free low dielectric resin composition whereby an electronic material prepared therefrom can have good high-frequency dielectric properties (for example, a Dk value of less than 4.0 and a Df value of less than 0.005 measured at 10 GHz) and good heat resistance, and also have satisfactory adhesion to copper foils and moldability.

In accordance with the objectives of the present invention described below, the technical means applied in the present invention for solving the problems of the prior art is to use in the polyphenylene ether resin composition a polyfunctional vinyl aromatic copolymer (such as, DVB copolymer) and an allyl cyclophosphazene compound with a specific structure. The halogen-free electronic material prepared from the halogen-free low dielectric resin composition of the present invention (herein also being referred to as "the resin composition of the present invention") possesses not only lower Dk and Df values, but also good adhesion to copper foils, moldability and heat resistance. Therefore, the electronic material prepared from the resin composition of the present invention is particularly suitable for high-frequency applications and can meet the high requirements of materials for advanced telecommunication applications. Examples of the high-frequency applications include but are not limited to 5th generation mobile networks (usually called 5G networks), advanced driver assistance systems (ADAS), and artificial intelligence (AI) applications.

An objective of the present invention is to provide a halogen-free low dielectric resin composition, which comprises the following components:

(A) a resin system, which includes:
(a1) a polyphenylene ether resin with unsaturated functional groups; and
(a2) a polyfunctional vinyl aromatic copolymer; and
(B) an allyl cyclophosphazene compound represented by the following formula (I):

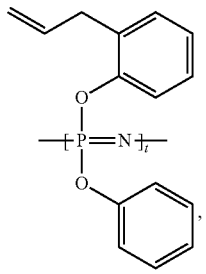

formula (I)

in formula (I), t is an integer ranging from 2 to 6, wherein, the polyfunctional vinyl aromatic copolymer (a2) is prepared by copolymerizing one or more divinyl aromatic compounds and one or more monovinyl aromatic compounds.

In some embodiments of the present invention, the polyfunctional vinyl aromatic copolymer (a2) comprises the following structural units:

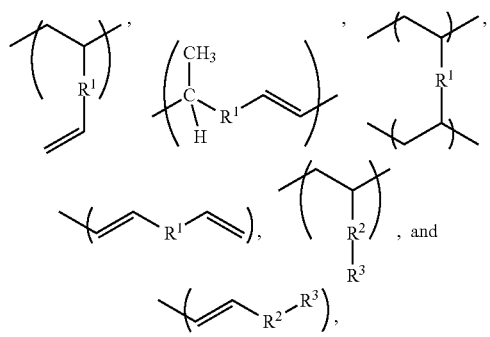

wherein, $R^1$ and $R^2$ are independently a C6-C12 aromatic hydrocarbyl, $R^3$ is H or a C1-C12 hydrocarbyl.

In some embodiments of the present invention, the polyphenylene ether resin (a1) with unsaturated functional groups comprises one or more polyphenylene ether resins represented by the following formula (II):

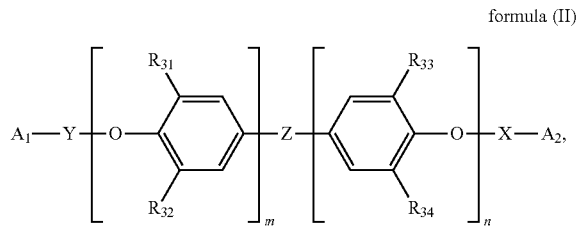

formula (II)

in formula (II), $R_{31}$, $R_{32}$, $R_{33}$ and $R_{34}$ are independently H, or a substituted or unsubstituted C1-C5 alkyl; m and n are independently an integer ranging from 0 to 100, with the proviso that m and n are not 0 at the same time;

X and Y are independently absent, or carbonyl or an alkenyl-containing group;

$A_1$ and $A_2$ are independently

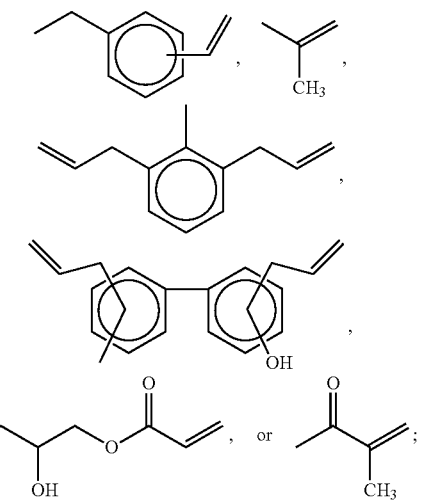

and

Z is absent, —O—,

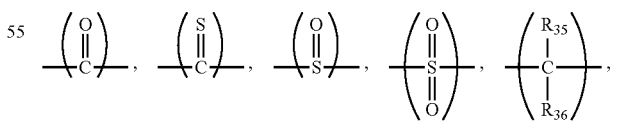

or aryl, wherein $R_{35}$ and $R_{36}$ are independently H or a C1-C12 alkyl.

In some embodiments of the present invention, the polyphenylene ether resin (a1) with unsaturated functional groups comprises at least two polyphenylene ether resins represented by the aforesaid formula (II), wherein $A_1$ and $A_2$ are independently

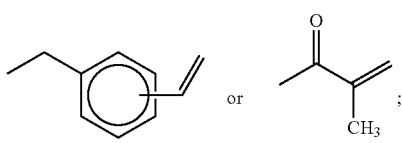

Z is aryl or

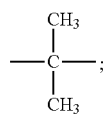

X and Y are absent; $R_{31}$, $R_{32}$, $R_{33}$ and $R_{34}$ are methyl; and $20 \leq (m+n) \leq 25$.

In some embodiments of the present invention, the weight ratio (a1:a2) of the polyphenylene ether resin (a1) with unsaturated functional groups to the polyfunctional vinyl aromatic copolymer (a2) is 9:1 to 3:7.

In some embodiments of the present invention, the divinyl aromatic compound is selected from the group consisting of divinylbenzene, divinylnaphthalene, divinylbiphenyl and isomers thereof.

In some embodiments of the present invention, the monovinyl aromatic compound is selected from the group consisting of a nuclear-alkyl-substituted vinyl aromatic compound, α-alkyl-substituted vinyl aromatic compound, β-alkyl-substituted vinyl aromatic compound, and alkoxyl-substituted vinyl aromatic compound.

In some embodiments of the present invention, the resin system (A) further comprises: (a3) an unsaturated functional group-containing crosslinking agent, wherein the unsaturated functional group-containing crosslinking agent (a3) is selected from the group consisting of a polyfunctional allylic compound, a polyfunctional acrylate, a polyfunctional acrylamide, a polyfunctional styrenic compound, a bismaleimide compound, and combinations thereof.

In some embodiments of the present invention, the unsaturated functional group-containing crosslinking agent (a3) is in an amount ranging from 1 part by weight to 20 parts by weight, based on 100 parts by weight of the resin system (A).

In some embodiments of the present invention, the allyl cyclophosphazene compound (B) is in an amount ranging from 5 parts by weight to 60 parts by weight, based on 100 parts by weight of the resin system (A).

In some embodiments of the present invention, the allyl cyclophosphazene compound (B) is represented by the following formula (I-1):

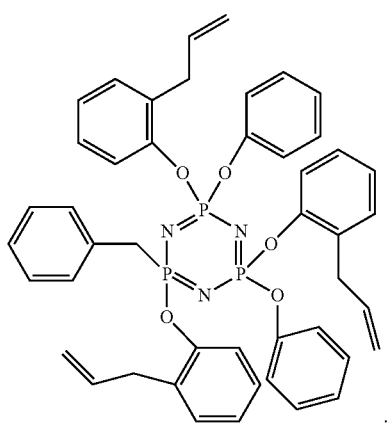

formula (I-1)

In some embodiments of the present invention, the halogen-free low dielectric resin composition further comprises a filler selected from the group consisting of silica (including spherical silica, fused silica, non-fused silica, porous silica, hollow silica and nano-silica), aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

Another objective of the present invention is to provide a prepreg, which is prepared by impregnating a substrate with the aforementioned resin composition or by coating the aforementioned resin composition onto a substrate, and drying the impregnated or coated substrate.

Yet another objective of the present invention is to provide a metal-clad laminate, which is prepared by laminating the aforementioned prepreg and a metal foil, or by directly coating the aforementioned resin composition onto a metal foil and drying the coated metal foil.

Yet another objective of the present invention is to provide a printed circuit board, which is prepared from the aforementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENTS

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing constituents in a solution, mixture or composition in the specification, the amount of each constituent is calculated based on the dry weight, i.e., regardless of the weight of the solvent.

As used herein, the term "resin solid portion" refers to all the other solid components excluding fillers in the resin composition. That is, the resin solid portion includes the polyphenylene ether resin (a1) with unsaturated functional groups, the polyfunctional vinyl aromatic copolymer (a2), and the allyl cyclophosphazene compound (B) as necessary components, and optional components (for example, the unsaturated functional group-containing crosslinking agent (a3) and a polymerization initiator).

As used herein, the term "halogen-free" refers to a resin composition substantially free of halogen, especially chlorine (Cl) and bromine (Br), to comply with the halogen-free standard for electronic products defined by the International Electrotechnical Commission (IEC). IEC-61249-2-21 issued by IEC defines "halogen-free" for electronic products as follows: Br<900 ppm, Cl<900 ppm, and (Cl+Br)<1500 ppm.

Compared with the prior art, the distinguishing feature of the present invention lies in that the halogen-free low dielectric resin composition of the present invention includes the polyphenylene ether resin, the polyfunctional vinyl aromatic copolymer, and the allyl cyclophosphazene compound with a specific structure, which renders the prepared electronic materials meeting the halogen-free requirement and also having low Dk and Df values, and at the same time having good adhesion to copper foils, moldability and heat resistance. Compared with the composition comprising a polyphenylene ether resin, a polyfunctional vinyl aromatic copolymer, and a phosphorus-containing compound other than those used in the present invention (such as a metal hypophosphate), electronic materials made from the resin composition of the present invention have significantly higher adhesion to copper foils and moldability. The components and preparation process of the halogen-free low dielectric resin composition of the present invention will be described in detail as follows.

1. RESIN COMPOSITION

The resin composition of the present invention comprises the resin system (A) and the allyl cyclophosphazene compound (B) represented by the following formula (I) as necessary components, and other optional components that may be used depending on the need.

1.1. Resin System (A)

The resin system (A) comprises the polyphenylene ether resin (a1) with unsaturated functional groups and the polyfunctional vinyl aromatic copolymer (a2) as necessary components, and other optional components that may be used depending on the need.

1.1.1. Polyphenylene Ether Resin (a1) having Unsaturated Functional Groups

As used herein, the polyphenylene ether resin with unsaturated functional groups refers to a resin with at least a repeating unit

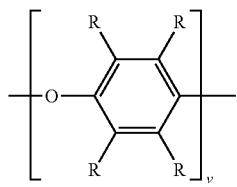

in the main chain and with unsaturated functional groups at the terminals, wherein Rs are independently H or a C1-C5 alkyl, and v is an integer ranging from 1 to 100. The unsaturated functional group refers to a group capable of carrying out addition polymerization with other components with unsaturated functional groups, and the addition polymerization reaction can be initiated by light or heat in the presence of a polymerization initiator. Examples of the unsaturated functional group include but are not limited to vinyl, vinyl benzyl, allyl, acrylate, and methacrylate. Examples of the polyphenylene ether resin with unsaturated functional groups include but are not limited to a vinyl-containing polyphenylene ether resin, an allyl-containing polyphenylene ether resin, a vinyl benzyl-containing polyphenylene ether resin, an acrylate-containing polyphenylene ether resin and a methacrylate-containing polyphenylene ether resin. Each of the polyphenylene ether resins with unsaturated functional groups can either be used alone or in any combination.

The method for preparing the polyphenylene ether resin with unsaturated functional groups is not the technical feature of the present invention, and people having ordinary skill in the art can carry out the method based on the disclosure of the present invention and ordinary skill. The related methods for preparing the polyphenylene ether resin with unsaturated functional groups are described in, for example, U.S. Pat. No. 6,995,195 B2 for vinyl benzyl-containing polyphenylene ether resins, U.S. Pat. No. 5,218,030 A for allyl-containing polyphenylene ether resins, U.S. Pat. No. 5,352,754 A for methacrylate-containing polyphenylene ether resins, U.S. Pat. No. 6,352,782 B2 and US 2016/0280913 A1, all of which are incorporated herein in their entireties by reference.

In some embodiments of the present invention, the polyphenylene ether resin (a1) with unsaturated functional groups comprises one or more polyphenylene ether resins represented by the following formula (II):

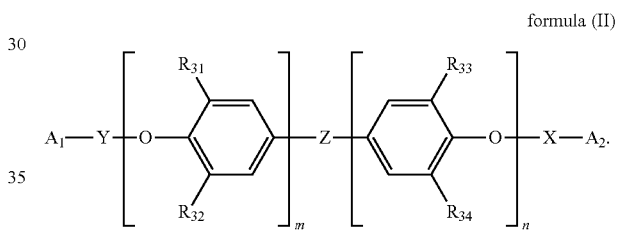

formula (II)

In formula (II), $R_{31}$, $R_{32}$, $R_{33}$ and $R_{34}$ are independently H, or a substituted or unsubstituted C1-C5 alkyl, and preferably are independently —$CH_3$; $A_1$ and $A_2$ are independently

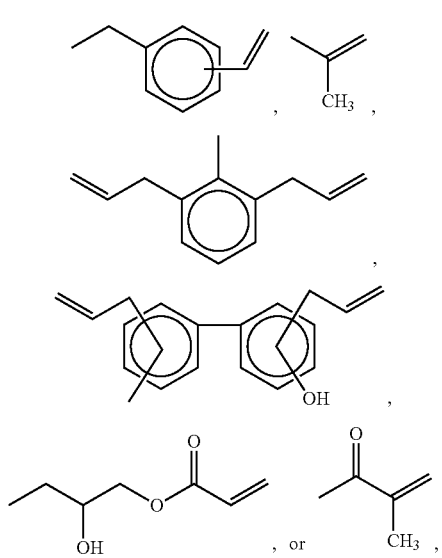

and preferably are independently

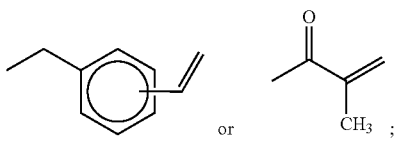

X and Y are independently absent, or carbonyl or an alkenyl-containing group, and preferably absent; m and n are independently an integer ranging from 0 to 100, with the proviso that m and n are not 0 at the same time; and Z is absent, —O—,

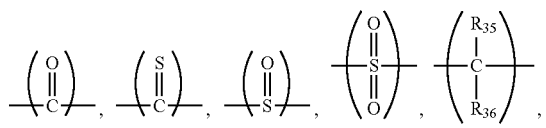

or aryl, wherein $R_{35}$ and $R_{36}$ are independently H or a C1-C12 alkyl, and Z is preferably aryl or

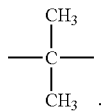

In a preferred embodiment of the present invention, the polyphenylene ether resin (1l) with unsaturated functional groups may comprise at least two polyphenylene ether resins represented by the aforementioned formula (II), wherein $A_1$ and $A_2$ are independently

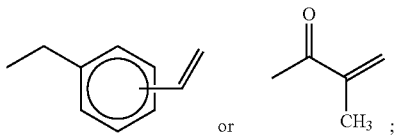

Z is aryl or

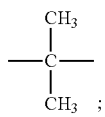

X and Y are absent; $R_{31}$, $R_{32}$, $R_{33}$ and $R_{34}$ are methyl; and $20 \leq (m+n) \leq 25$. It has been found that the combination of two polyphenylene ether resins with different end functional groups can increase the degree of crosslinking of the resin composition, thereby improving the heat resistance of the prepared electronic materials, for example, significantly increasing the glass transition temperature (Tg) of the prepared electronic materials.

Examples of commercially available polyphenylene ether resin (a1) with unsaturated functional groups include OPE-2st and OPE-2EA available from MITSUBISHI GAS CHEMICAL Company, SA-9000 available from SABIC Company, PP807 available from Chin Yee Chemical Industry Company, and a polyphenylene ether resin available from ASAHI KASEI Company.

In the resin composition of the present invention, the polyphenylene ether resin (a1) with unsaturated functional groups may have a weight average molecular weight (Mw) of from 1000 to 50,000, preferably from 1000 to 10,000, and more preferably from 1000 to 5000. If the Mw of the polyphenylene ether resin is above the aforementioned range, the properties of the resin composition, such as moldability (fluidity), solubility, etc., may degrade, which makes it difficult for the subsequent processing. On the other hand, if the Mw of the polyphenylene ether resin is below the aforementioned range, the dielectric properties and thermal stability of the resin composition may degrade.

In the resin composition of the present invention, based on the total weight of the resin system (A), the amount of the polyphenylene ether resin (a1) with unsaturated functional groups can range from 30 wt % to 90 wt %, and more specifically from 35 wt % to 85 wt %, such as 37 wt %, 38 wt %, 40 wt %, 42 wt %, 45 wt %, 47 wt %, 50 wt %, 52 wt %, 55 wt %, 58 wt %, 60 wt %, 62 wt %, 63 wt %, 65 wt %, 67 wt %, 70 wt %, 72 wt %, 75 wt %, 77 wt %, 78 wt %, 80 wt %, or 82 wt %.

In addition, when the polyphenylene ether resin (a1) with unsaturated functional groups comprises two polyphenylene ether resins with different end functional groups, the ratio of the first polyphenylene ether resin to the second polyphenylene ether resin may range from 3:1 to 1:3, preferably 2:1 to 1:2, for example, 1.67:1, 1.5:1, 1.33:1, 1.25:1, 1:1, 1:1.25, 1:1.33, 1:1.5, or 1:1.67.

1.1.2. Polyfunctional Vinyl Aromatic Copolymer (a2)

As used herein, the polyfunctional vinyl aromatic copolymer refers to a vinyl aromatic copolymer with at least three reactive vinyl groups. In the resin composition of the present invention, the polyfunctional vinyl aromatic copolymer undergoes crosslinking reaction with the polyphenylene ether resin with unsaturated functional groups via the reactive vinyl groups to form a stereo network structure. As used herein, the reactive vinyl groups include —CH=CH$_2$ and ethylene (—CH=CH—).

The polyfunctional vinyl aromatic copolymer (a2) can be obtained by copolymerization of one or more divinyl aromatic compounds, one or more monovinyl aromatic compounds and optionally other monomers. The thus obtained polyfunctional vinyl aromatic copolymer not only have one or more reactive vinyl groups at the terminals, and also have one or more reactive ethylene in the main chain, thereby being capable of undergoing crosslinking reactions with other components having unsaturated functional groups.

In some embodiments of the present invention, the polyfunctional vinyl aromatic copolymer (a2) may comprise the following structural units:

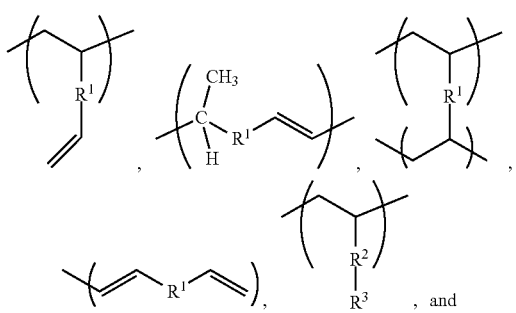

-continued

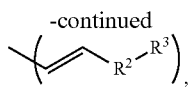

wherein, $R^1$ and $R^2$ are independently a C6-C12 aromatic hydrocarbyl, $R^3$ is H or a C1-C12 hydrocarbyl.

As used herein, a divinyl aromatic compound refers to an aromatic compound with two vinyl groups. Examples of divinyl aromatic compound include but are not limited to divinylbenzene, divinylnaphthalene, divinyl-biphenyl, and isomers thereof. Each of the divinyl aromatic compounds can be used alone or in any combination. In some embodiments of the present invention, the divinyl aromatic compound is divinylbenzene, which includes but not are limited to m-divinylbenzene and p-divinylbenzene.

As used herein, a monovinyl aromatic compound refers to an aromatic compound with one vinyl group. Examples of monovinyl aromatic compound include but are not limited to nuclear-alkyl-substituted vinyl aromatic compound, a-alkyl-substituted vinyl aromatic compound, (3-alkyl-substituted vinyl aromatic compound, and alkoxy-substituted vinyl aromatic compound. Each of the monovinyl aromatic compounds can be used alone or in any combination. In some embodiments of the present invention, the monovinyl aromatic compound is one or more members selected from the group consisting of ethyl vinylbenzene (including but not limited to m-ethyl vinylbenzene and p-ethyl vinylbenzene), ethyl vinylnaphthalene, and ethyl vinyl-biphenyl, and is preferably ethyl vinylbenzene.

Examples of the optionally other monomers useful for preparing the polyfunctional vinyl aromatic copolymer include but are not limited to trivinyl aromatic compounds, trivinyl aliphatic compounds, divinyl aliphatic compounds, and monovinyl aliphatic compounds. What should be noted is that the content of the optionally other monomers is preferably not higher than 50 mole %, more preferably not higher than 30 mole %, based on the total moles of the divinyl aromatic compounds, monovinyl aromatic compounds and the optionally other monomers. In other words, in the polyfunctional vinyl aromatic copolymer, the majorities of the polymerization units are those derived from the divinyl aromatic compounds and monovinyl aromatic compounds.

In the resin composition of the present invention, the Mw of the polyfunctional vinyl aromatic copolymer (a2) can be from 500 to 10,000, preferably from 1000 to 5000. If the Mw of the polyfunctional vinyl aromatic copolymer is too high, such as higher than 10,000, the fluidity of the resin composition may degrade, which makes it difficult for subsequent processing. On the other hand, if the Mw of the polyfunctional vinyl aromatic copolymer is too low, such as lower than 500, the heat resistance of the resultant resin composition after being cured may degrade.

An example of the method for preparing the polyfunctional vinyl aromatic copolymer (a2) may be described as follows: a method comprising copolymerizing the divinyl aromatic compound, the monovinyl aromatic compounds and the optionally other monomers in the presence of a Lewis base compound and catalyst, wherein the catalyst is at least one member selected from the group consisting of inorganic acids, organic sulfonic acids and perchlorates. The Lewis base compound acts as promoter, which during the polymerization reaction can control the interaction between the catalyst and the hydrogen at β position of carbonium to regulate the relative reaction rate between the β-dehydrogenation reaction and 1,2-addition reaction of vinyl groups.

For more details of the preparation method of the polyfunctional vinyl aromatic copolymer (a2), reference can be made to TW 201736413 A, which is incorporated herein in its entirety by reference.

In the resin composition of the present invention, the content of the polyfunctional vinyl aromatic copolymer (a2) may be, based on 100 parts by weight of the resin system (A), from 10 parts by weight to 70 parts by weight, more specifically from 15 parts by weight to 65 parts by weight, for example, 20 parts by weight, 22 parts by weight, 25 parts by weight, 28 parts by weight, 30 parts by weight, 32 parts by weight, 35 parts by weight, 37 parts by weight, 40 parts by weight, 42 parts by weight, 45 parts by weight, 48 parts by weight, 50 parts by weight, 52 parts by weight, 55 parts by weight, 57 parts by weight, or 60 parts by weight.

It has been found that, in the resin composition of the present invention, the weight ratio of the polyphenylene ether resin (a1) to the polyfunctional vinyl aromatic copolymer (a2), (a1:a2), is preferably from 9:1 to 3:7 for example, 8:1, 7.5:1, 7:1, 6.5:1, 6:1, 5.5:1, 5:1, 4.5:1, 4:1, 3.5:1, 3:1, 2.5:1, 2:1, 1.5:1, 1:1, 1:1.5, or 1:2. If the content of the polyfunctional vinyl aromatic copolymer (a2) is higher than the above said range, the electronic materials prepared therefrom will have worse heat resistance and adhesion. On the other hand, if the content of the polyfunctional vinyl aromatic copolymer (a2) is lower than the above said range, the electronic materials prepared therefrom will have worse physicochemical properties.

1.1.3. Unsaturated Functional Group-Containing Crosslinking Agent (a3) (Optional Component)

In the resin composition of the present invention, the resin system (A) may optionally comprise an unsaturated functional group-containing crosslinking agent (a3) to further enhance the properties of the prepared electronic materials. The unsaturated functional group-containing crosslinking agent refers to a component with unsaturated functional groups capable of undergoing crosslinking reaction with the polyphenylene ether resin and the polyfunctional vinyl aromatic copolymer to form a stereo network structure, wherein the unsaturated functional groups are as those defined above. The crosslinking agent preferably has good compatibility with the polyphenylene ether resin and the polyfunctional vinyl aromatic copolymer, such that the formed resin composition can have a good appearance after curing. The unsaturated functional group-containing crosslinking agent may be classified into monofunctional crosslinking agent and polyfunctional crosslinking agent, depending on the amounts of the unsaturated functional groups contained therein, wherein the monofunctional crosslinking agent has only an unsaturated functional group, and the polyfunctional crosslinking agent has at least two unsaturated functional groups. In the present invention, in order to make a resin composition has a higher crosslinking density after curing, it is preferred to use a polyfunctional crosslinking agent.

Examples of the polyfunctional crosslinking agent include but are not limited to polyfunctional allylic compounds, polyfunctional acrylates, polyfunctional styrenic compounds, and bismaleimide compounds. Each of the aforementioned polyfunctional crosslinking agents can either be used alone or in any combination.

The polyfunctional allylic compound refers to a compound containing at least two allyl groups. Examples of the polyfunctional allylic compound include but are not limited to diallyl phthalate, diallyl isophthalate, triallyl trimellitate, triallyl mesate, triallyl isocyanurate (TAIC), triallyl cyanurate (TAC), and prepolymers thereof.

The polyfunctional acrylate refers to a compound containing at least two acrylate groups. Examples of the polyfunctional acrylate include but are not limited to trimethylolpropane tri(meth)acrylate, 1,6-hexanediol di(meth)acrylate, ethylene glycol di(meth)acrylate, propylene glycol di(meth)acrylate, 1,3-butanediol di(meth)acrylate, 1,4-butanediol di(meth)acrylate, cyclohexane dimethanol di(meth)acrylate, diethylene glycol di(meth)acrylate, triethylene glycol di(meth)acrylate, and prepolymers thereof.

The polyfunctional styrenic compound refers to a compound with at least two alkenyl groups attached to the aromatic ring. Examples of the polyfunctional styrenic compound include but are not limited to 1,3-divinylbenzene, 1,4-divinylbenzene, trivinylbenzene, 1,3-diisopropenylbenzene, 1,4-diisopropenylbenzene, 1,2-bis(p-vinylphenyl)ethane, 1,2-bis(m-vinylphenyl)ethane, 1-(p-vinylphenyl)-2-(m-vinylphenyl)-ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-4-(m-vinylphenylethyl)benzene, 1-(p-vinylphenylethyl)-3-(m-vinylphenylethylbenzene, and prepolymers thereof.

The bismaleimide compound refers to a compound with at least two maleimide functional groups. A maleimide functional group has reactive double bonds and thus can react with other components with unsaturated functional groups. In some embodiments of the present invention, the bismaleimide compound is represented by the following formula (III):

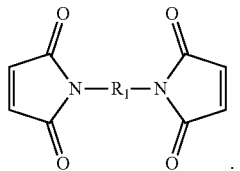

formula (III)

In formula (III), $R_1$ is an organic group and preferably selected from the following group consisting of: methylene (—CH$_2$—), 4,4'-diphenylmethane group

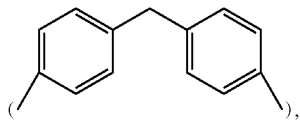

m-phenylene

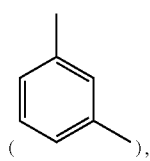

bisphenol A diphenyl ether group

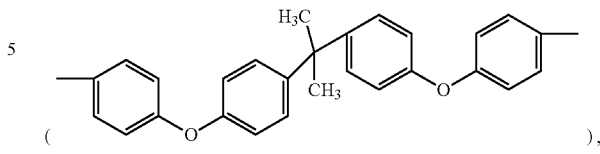

3,3'-dimethyl-5,5'-diethyl-4,4'-diphenylmethane group

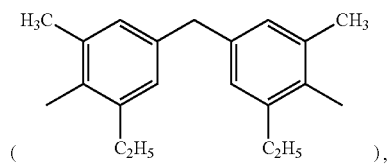

4-methyl-1,3-phenylene

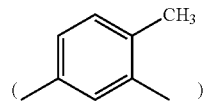

and 2,2,4-trimethyl-1,6-hexylene

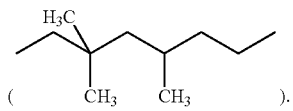

Specific examples of the bismaleimide compound include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenl)pyridine, 2,6-bismaleimidopyridine, 1,3-bis(maleimidomethyl)cylcohexane, 1,3-bis(maleimidomethyl)benzene, 1,1-bis(4-maleimidophenylcyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether)bismaleimide, N,N'-(4,4'-diphenylsulfone)bismaleimide, N,N'-(4,4'-dicyclohexylmethane)bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene)bismaleimide. Commercially available bismaleimide resins include BMI-70 and BMI-80 available from KI Chemical Company, and BMI-1000, BMI-4000, BMI-5000, BMI-5100, BMI-7000, BMI-2000 and BMI-2300 (CAS 67784-74-1) available from Daiwa Fine Chemical Company. The aforementioned bismaleimides can either be used alone or in any combination, and people with ordinary skill in the art could adjust the amount of the bismaleimide depending on the need. In the appended examples, 3,3'-dimethyl-5,5'-diethyl-4,4'-diphenylmethyl-bismaleimide (that is, in formula (III), $R_1$ is 3,3'-dimethyl-5,5'-diethyl-4,4'-diphenylmethane group

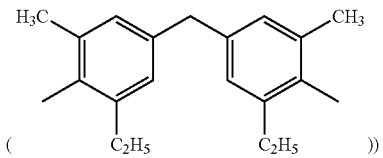

is used.

Considering the compatibility between the components in the resin composition, the unsaturated functional group-containing crosslinking agent (a3) is preferably selected from the following group consisting of: TAIC, TAC, 1,3-divinylbenzene, 1,4-divinylbenzene, 1,2-bis(p-vinylphenyl)ethane, 1,2-bis(m-vinylphenyl)ethane, 1-(p-vinylphenyl)-2-(m-vinylphenyl)-ethane, 3,3'-dimethyl-5,5'-diethyl-4,4'-diphenylmethylbismaleimide, and combinations thereof.

In the resin composition of the present invention, the unsaturated functional group-containing crosslinking agent (a3) may have an Mw of from 100 to 5000, preferably from 100 to 4000, and more preferably from 100 to 3000. If the Mw of the crosslinking agent is above the aforementioned range, for example higher than 5000, the viscosity of the resin composition may be too high, which is disadvantageous for subsequent processing. On the other hand, if the Mw of the crosslinking agent is below the aforementioned range, for example lower than 100, the crosslinking agent is apt to volatilize during the curing process, thereby changing the ratios between the components in the resin composition after the curing process and in turn failing to achieve the desired properties.

In the resin composition of the present invention, the content of the unsaturated functional group-containing crosslinking agent (a3) may be, based on 100 parts by weight of the resin system (A), from 1 part by weight to 20 parts by weight, more specifically from 5 parts by weight to 15 parts by weight, for example 6 parts by weight, 7 parts by weight, 8 parts by weight, 9 parts by weight, 10 parts by weight, 11 parts by weight, 12 parts by weight, 13 parts by weight, or 14 parts by weight. If the content of the unsaturated functional group-containing crosslinking agent is above the aforementioned range, for example higher than 20 parts by weight, the electronic materials prepared therefrom may not have good dielectric properties, for example the Df value may be too high. On the other hand, if the content of the unsaturated functional group-containing crosslinking agent is below the aforementioned range, for example lower than 1 part by weight, the crosslinking density of the resin composition after curing cannot be increased, and thus, adversely affects the heat resistance and dimensional stability of the electronic materials produced therefrom.

1.1.4. Other Optional Components

In the resin composition of the present invention, the resin system (A) may optionally further comprise other optional components, such as polymerization initiators, vinyl-containing elastomers, epoxy resins and additives well-known in this technical field, as those illustrated below, to adaptively improve the workability of the resin composition during manufacturing, or the physicochemical properties of the electronic material prepared from the resin composition. The additives well-known in this technical field include but are not limited to curing agents and curing accelerators.

[Polymerization Initiator]

The resin system (A) of the resin composition of the present invention may optionally further comprise a polymerization initiator to assist in inducing polymerization. Examples of the polymerization initiators include but are not limited to azobisisobutyronitrile, azobis(2-isopropyl)butyronitrile, azobisisoheptonitrile, dibenzoyl peroxide, acetylisobutyryl peroxide, diacetyl peroxide, 2,4-dichlorobenzoyl peroxide, 2-dimethylbenzoyl peroxide, lauroyl peroxide, diisopropyl peroxydicarbonate, bis(3,5,5-trimethyl-hexanoyl) peroxide, cyclohexanone peroxide, methyl ethyl ketone peroxide, dicyclohexylpropyl peroxydicarbonate, dicyclohexyl peroxydicarbonate, bis(4-tert-butylcyclohexyl) peroxydicarbonate, bis(2-ethylhexyl) peroxydicarbonate, bis(2-phenylethoxy) peroxydicarbonate, dihexadecyl peroxydicarbonate, tert-butyl peroxybenzoate, tert-butyl peroxyphenylacetate, peracetic acid, tert-butyl peroxypivalate, tert-hexyl peroxypivalate, cumyl peroxyneodecanoate, tert-butyl hydroperoxide, cumene hydroperoxide, p-menthane hydroperoxide, dicumyl peroxide, ditert-butyl peroxide, hydrogen peroxide, ammonium persulfate, potassium persulfate, peroxide-alkyl metal, and oxy-alkyl metal.

Commercially available polymerization initiators include PERBUTYL P, PERHEXA 25B, and PERHEXYNE 25B, all available from Nippon Oil & Fats (NOF) Company. Content of the polymerization initiator is not particularly limited, and people skilled in this technical field based on the disclosures of the invention may optionally adjust the content. In general, the content of the polymerization initiator in the resin composition may range from 0.01 wt % to 3 wt %, based on the total weight of the resin solid portion, but the present invention is not limited to this range.

[Vinyl-Containing Elastomer]

As used herein, an elastomer refers to a polymer with viscoelasticity which imparts toughness to an electronic material, in the resin composition of the present invention, the resin system (A) may optionally further include a vinyl-containing elastomer which can undergo a crosslinking reaction with other components with an unsaturated functional group such that the prepared electronic material has better toughness and lower ilk and Df values.

In general, a vinyl-containing elastomer is formed by the polymerization of the repeating units of monomers with carbon-carbon unsaturated bonds, and a pendant vinyl group is present on the main chain of the polymer or on a branch or a terminal group thereof, wherein the pendant vinyl content usually expressed in percentage is preferably greater than 10%, and more preferably greater than 50%.

The vinyl-containing elastomer max be, for example, omopolymer polymerized from conjugated-diene monomers, and a copolymer copolymerized from conjugated-diene monomers and other monomers. The Mw of the vinyl-containing elastomer may be from 200 to 100,000, preferably from 1000 to 5000, and more preferably from 1000 to 3000. Examples of the conjugated-diene monomers include butadiene and isoprene, and examples of other monomers include styrene and maleic anhydride.

Examples of the vinyl-containing elastomer include but are not limited to polybutadiene, styrene-butadiene copolymer, styrene-butadiene-styrene (SBS)di/tri block copolymer, polyisoprene, styrene-isoprene copolymer, styrene-isoprene-styrene (SIS)di/tri block copolymer, acrylonitrile-butadiene copolymer, acrylonitrile-butadiene-styrene block copolymer, and combinations thereof. Commercially available vinyl-containing elastomers include Ricon 100, Ricon 181, Ricon 184, Ricon 104H, Ricon 250, Ricon 257, Ricon 157, Ricon 130, Ricon 130MA and Ricon 184MA available from Cray Valley Company, B3000 available from Nippon Soda Company, and Kraton DX1300 available from Shell Oil Company.

In the resin composition of the present invention, the weight ratio of the polyphenylene ether resin (a1) with unsaturated functional groups to the vinyl-containing elastomer is preferably from 9:1 to 1:1, more preferably from 7:3 to 3:2. If the content of the vinyl-containing elastomer is too high, for example so high as to fall out of the above said preferred weight ratio range, the heat resistance and dimensional stability of the electronic materials produced therefrom may degrade. On the other hand, if the content of the vinyl-containing elastomer is too low, for example so low as to fall out of the above said preferred weight ratio range, the vinyl-containing elastomer may not provide the desired toughness-enhancing effect, causing the degradation of the physical properties of the electronic materials produced therefrom.

[Epoxy Resin]

Under the condition that the overall properties of the resin composition of the present invention will not be adversely affected, the resin system (A) of the resin composition may optionally further comprise an epoxy resin to improve the physicochemical properties of the prepared electronic materials. As used herein, an epoxy resin refers to a thermosetting resin with at least two epoxy functional groups in each molecule, including but not limited to a bifunctional epoxy resin, a tetrafunctional epoxy resin, an octafunctional epoxy resin, or a linear phenolic epoxy resin. In the resin composition of the present invention, the type of the epoxy resin is not particularly limited. People having ordinary skill in the art may select and use the epoxy resin, based on the disclosure of the present invention and depending on the need. However, in order to meet the halogen-free requirements for the resin composition of the present invention, the epoxy resin should be a halogen-free epoxy resin, and particularly a bromine-free epoxy resin.

To avoid the adverse effects on the dielectric properties and heat resistance of the prepared electronic materials, it is preferred to use an epoxy resin with a high glass transition temperature (Tg), and low Dk and Df values. For example, a dicyclopentadiene (DCPD)-type epoxy resin may be used.

[Curing Agent and Curing Accelerator]

In the case that the resin composition comprises an epoxy resin, a curing agent and a curing accelerator suitable for the epoxy resin may be further added to promote the ring-opening reaction of epoxy functional groups and lower the curing reaction temperature of the resin composition. The types of the curing agent and curing accelerator are not particularly limited so long as they can promote the ring-opening reaction of epoxy functional groups and lower the curing reaction temperature. Suitable curing agents include but are not limited to an OH group-containing compound an amine-containing compound, an acid anhydride compound, and an active ester compound, wherein each of the mentioned curing agents can either be used alone or in combination. Examples of the curing agent include but are not limited to phenolic resin, styrene maleic anhydride (SMA), dicyandiamide, diaminophenylsulfone, dianilinomethane, phenolic resin, aromatic diamine, aromatic dianhydride, aliphatic dianhydride, benzoxazine resin, cyanate resin, phenolic triazine resin, and copolymer of styrene and vinylphenol. The content of the curing agent is not particularly limited, and people with ordinary skill in the art based on the disclosure of the present invention can adjust the amount of the curing agent, depending on the need. In general, based on the total weight of the resin solid portion, the content of the curing agent can range from 5 wt % to 25 wt %, but the present invention is not limited thereto.

Suitable curing accelerators include but are not limited to a tertiary amine, a quaternary ammonium salt, an imidazole compound, and a pyridine compound, wherein each of the mentioned curing accelerators can either be used alone or in combination. Examples of the pyridine compounds include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, or 2-amino-3-nitropyridine. The content of the curing accelerator is not particularly limited, and people with ordinary skill in the art based on the disclosure of the present invention can adjust the amount of the curing accelerator, depending on the need. In general, based on the total weight of the resin solid portion, the amount of the curing accelerator can range from 0.5 wt % to 5 wt %, but the present invention is not limited thereto.

1.2. Allyl Cyclophosphazene Compound (B)

The resin composition of the present invention comprises an allyl cyclophosphazene compound (B) represented by the following formula (I):

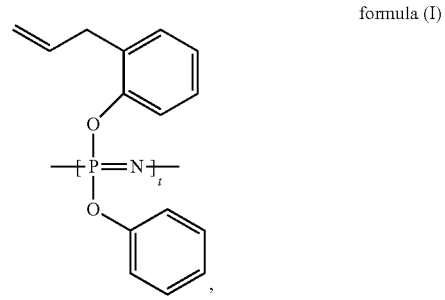

formula (I)

In formula (I), t is an integer ranging from 2 to 6. In the following appended Examples, t is 3.

The allyl cyclophosphazene compound represented by formula (I) is a derivative of a phosphazene compound and has one or more allyl groups which can react with other components with unsaturated functional groups. Thus, the cyclophosphazene compound represented by formula (I) is a reactive phosphorus-containing compound. It has been found that compared with conventional non-reactive phosphorus-containing compounds, for example hexaphenoxycyclotriphosphazene, which may be SPB-100 available from Otsuka Chemical Company, the cyclophosphazene compound represented by formula (I) can react with other components with unsaturated functional groups to together form a stereo network structure. In other words, the cyclophosphazene compound represented by formula (I) can form a part of the cured product of the resin composition, whereby the incompatibility problem of the conventional non-reactive phosphorus-containing compounds that they separate out at high temperatures, or that stratification occurs between said conventional compounds and the cured product, can be avoided. In addition, it has been found that when the polyphenylene ether resin, the polyfunctional vinyl aromatic copolymer and the allyl cyclophosphazene compound represented by formula (I) are used in combination, the electronic materials thus produced have surprisingly excellent moldability, heat resistance, and adhesion to copper foils.

The methods for preparing the allyl cyclophosphazene compound represented by formula (I) are not particularly limited, and are not the technical features of the present invention. Reference may be made to related publications such as US 2011/0130497 A1, TW 445276 B, U.S. Pat. No. 6,518,336 B1, and U.S. Pat. No. 6,743,841 B2, all of which are incorporated herein in their entireties by reference.

In some embodiments of the present invention, the allyl cyclophosphazene compound (B) is represented by the following formula (I-1):

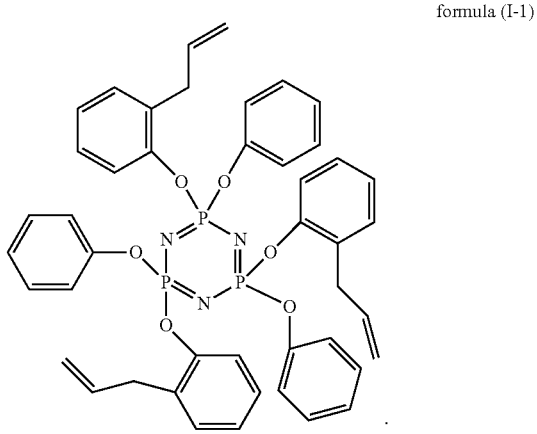 [SMILES: C=CCc1ccccc1OP1(Oc2ccccc2)=NP(Oc2ccccc2)(Oc2ccccc2CC=C)=NP(Oc2ccccc2)(Oc2ccccc2CC=C)=N1]

formula (I-1)

The allyl cyclophosphazene compound (B) represented by formula (I-1) can be prepared by reactions between hexachloro cyclophosphazene

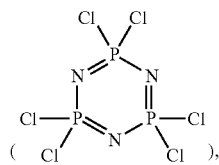

o-allyl phenol

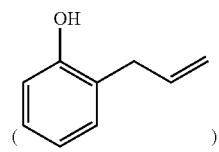

and phenol

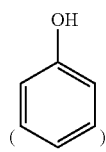

in appropriate ratios followed by subsequent purification. Commercially available allyl cyclophosphazene compound represented by formula (I-1) may be SPB-100 available from Otsuka Chemical Company.

In the resin composition of the present invention, the content of the allyl cyclophosphazene compound (B) may be, based on 100 parts by weight of the resin system (A), from 5 parts by weight to 60 parts by weight, more specifically from 10 parts by weight to 55 parts by weight, for example, 12 parts by weight, 15 parts by weight, 18 parts by weight, 20 parts by weight, 22 parts by weight, 25 parts by weight, 28 parts by weight, 30 parts by weight, 32 parts by weight, 35 parts by weight, 38 parts by weight, 40 parts by weight, 42 parts by weight, 45 parts by weight, 48 parts by weight, 50 parts by weight, or 52 parts by weight. If the content of the allyl cyclophosphazene compound (B) is above the aforementioned range, for example higher than 60 parts by weight, the moisture resistance and dielectric properties of the prepared electronic materials will degrade due to the excessive phosphor atoms. On the other hand, if the content of the allyl cyclophosphazene compound (B) is below the aforementioned range, for example lower than 5 parts by weight, the flame retardance, moldability and adhesion to copper foils of the prepared electronic materials will degrade.

In addition, in the resin composition of the present invention, it is preferred that the total content of the allyl cyclophosphazene compound (B) and the optional phosphorus-containing flame retardant which will be described below makes the total content of phosphorus atoms in the resin composition at least 1 wt %, preferably from 1 wt % to 6 wt %, based on the total weight of the resin solid portion, for the purpose that the prepared electronic materials can simultaneously have good flame retardance, moisture resistance, dielectric properties and adhesion to copper foils.

1.3. Filler (Optional Component)

The resin composition of the present invention may optionally further comprise a filler to improve the mechanical strength, thermal conductivity and dimensional stability of the prepared electronic materials. Examples of the suitable fillers include but are not limited to silica (for example, spherical silica, fused silica, non-fused silica, porous silica, hollow silica or nano silica), aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof For providing the low Dk and Df electronic materials that the present invention is particularly targeted at, silica or boron nitride is preferred.

In the resin composition of the present invention, the shape of the filler is not particularly limited and may be, for example, a spherical shape, a fibrous shape, a plate shape, a granular shape, a sheet shape, a whiskered shape, or the like, but the present invention is not limited thereto. In general, the size of the filler is not particularly limited; however, to improve the effect of the filler and the quality of the prepared electronic material, the size of the filler should not be too large. In the case of a spherical or granular filler, the average particle diameter is generally less than 10 μm, preferably less than 5 μm, and more preferably less than 2.5 μm.

In addition, to increase the compatibility between the filler and other components of the resin composition, and the workability of the resin composition, the filler may be surface-modified with a coupling agent before being added into the resin composition. Examples of the coupling agent include but are not limited to a silane coupling agent, a titanate coupling agent, a zirconate coupling agent, and a poly-siloxane coupling agent. Examples of the silane coupling agent include but are not limited to epoxy silane, amino silane, vinyl silane, and acrylic silane. Considering the reactivity with a polyphenylene ether resin with unsaturated functional groups, it is preferred that vinyl silane is used as a coupling agent for surface-modification of the filler. Examples of the vinyl silane include but are not limited to vinyltrimethoxy silane and vinyltriethoxy silane. The method for surface-modifying the filler is not a technical feature of the present invention, and can be easily accomplished by people having ordinary skill in the art based on the disclosure of the present invention and the ordinary skill. The detailed description of the surface-modification method of the filler can be also found in, for example, U.S. Pat. No. 6,524,717 B1, which is incorporated herein in its entirety by reference.

Commercially available fillers include silica products of the Admafuse series, the Admafine series, and the Admanano series, and SC1050, SC2050, SC4050, SC5500, and SE2050, available from Admatechs Company.

In the resin composition of the present invention, based on the total weight of the resin composition, the amount of the filler can range from 0 wt % to 40 wt %, and more particularly from 5 wt % to 35 wt %, such as 7 wt %, 8 wt %, 10 wt %, 12 wt %, 15 wt %, 18 wt %, 20 wt %, 23 wt %, 25 wt %, 27 wt %, 30 wt %, 32 wt %, or 34 wt %.

1.4. Other Optional Components

The resin composition of the present invention may, depending on the need, further comprise other optional components, such as other phosphorus-containing flame retardants which will be illustrated below, and additives known in this technical field, so as to adaptively improve the workability of the resin composition during manufacturing or improve the physicochemical properties and flame retardance of the electronic materials prepared from the resin composition.

In the resin composition of the present invention, in addition to the allyl cyclophosphazene compound (B), other phosphorus-containing flame retardants with structures not consistent with formula (I) may further be added. In order to meet the halogen-free requirements of the resin composition of the present invention, the other phosphorus-containing flame retardants should be free of halogen. Examples of the other phosphorus-containing flame retardants include but are not limited to metal phosphinate, polyphosphate, phosphonium salt, phosphate ester, phosphazene having a structure not consistent with formula (I), phosphite ester, and phosphine oxide.

Examples of the metal phosphinate include but are not limited to aluminum dialkylphosphinate, aluminum tris(diethylphosphinate), aluminum tris(methylethylphosphinate), aluminum tris(diphenylphosphinate), zinc bis(diethylphosphinate), zinc bis(methylethylphosphinate), zinc bis(diphenylphosphinate), titanyl bis(diethylphosphinate), titanyl bis(methylethylphosphinate), and titanyl bis(diphenylphosphinate). One commercially available phosphinate is OP935 available from CLARIANT Company.

Examples of the polyphosphate include but are not limited to melamine polyphosphate, melam polyphosphate, and melem polyphosphate. One commercially available polyphosphate is Melapur 200 available from BASF Company.

An example of the phosphonium salt is, but is not limited to, tetraphenylphosphonium tetraphenylborate. Examples of the phosphate ester include but are not limited to a condensed phosphate ester compound, and a cyclic phosphate ester compound. Examples of the condensed phosphate ester compound include but are not limited to triphenyl phosphate, tricresyl phosphate, xylenyl-diphenyl phosphate, cresyl-diphenyl phosphate, resorcinol bis-xylenylphosphate (RXP), resorcinol bis-diphenylphosphate (RDP), and 9,10-dihydro-9-oxa-10-phosphaphenanthrene-10-oxide (DOPO). Commercially available phosphate esters include PX-200 and PX-202 available from Daihachi Chemical Iudustry Company, and CG-686 and CG-RDP available from Chembridge Company.

The phosphazenes with a structure not consistent with formula (I) include cyclic and linear phosphazene compounds, each having a structure not consistent with formula (I). Commercially available phosphazenes with a structure not consistent with formula (I) include SPB-100 and SPH-100, both available from Otsuka Chemical Company. Examples of the phosphite ester include but are not limited to trimethylphosphite and triethylphosphite. Examples of the phosphine oxide include but are not limited to tris-(4-methoxyphenyl)phosphine oxide, triphenyl phosphine oxide, diphenyl phosphine oxide, and derivatives thereof. Commercially available phosphine oxides include PQ-60, available from Chin Yee Chemical Industry Company, and BPO-13 and BPE-3, available from Katayama Chemical Industries Company.

The contents of the other phosphorus-containing flame retardants are not particularly limited. However, as described above, it is preferred that the total content of the other phosphorus-containing flame retardants and the allyl cyclophosphazene compound (B) makes the total content of phosphorus atoms in the resin composition at least 1 wt %, more preferably from 1 wt % to 6 wt %, based on the total weight of the resin solid portion, so that the prepared electronic materials can simultaneously have good flame retardance, moisture resistance, dielectric properties and adhesion to copper foils.

1.5. Preparation of Resin Composition

The resin composition of the present invention may be prepared into a varnish for subsequent processing by uniformly mixing the components of the resins composition, including the polyphenylene ether resin, the polyfunctional vinyl aromatic copolymer, the allyl cyclophosphazene compound represented by formula (I), and other optional components, through a stirrer, and dissolving or dispersing the obtained mixture in a solvent. The said solvent can be any inert solvent that can dissolve or disperse the components of the resin composition but does not react with the components of the resin composition. Examples of the solvent that can dissolve or disperse the components of the resin composition include but are not limited to toluene, y-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrrolidone (NMP), wherein each of the mentioned solvents can either be used alone or in combination. The amount of the solvent is not particularly limited so long as the components of the resin composition can be evenly dissolved or dispersed therein. In the following appended Examples, a mixture of toluene, methyl ethyl ketone and γ-butyrolactone is used as the solvent.

2. PREPREG

The present invention also provides a prepreg prepared from the aforementioned resin composition, wherein the prepreg is prepared by impregnating a substrate with the aforementioned resin composition or by coating the aforementioned resin composition onto a substrate and drying the impregnated or coated substrate. The method for preparing the prepreg is not particularly limited, and can be easily accomplished by people having ordinary skill in the art based on the disclosure of the present invention and the ordinary skill. Specifically, the method for impregnating or coating resin compositions include but are limited to impregnating, roll coating, die coating, bar coating, and spraying. The impregnated or coated substrate can be dried at a temperature of 80° C. to 180° C. for 1 to 10 minutes to obtain a semi-cured (B-stage) prepreg.

The ordinary substrates comprise glass fiber reinforcing materials (e.g., glass-fiber woven fabrics, glass papers, glass mats, etc.), kraft papers, short fiber cotton papers, natural fiber cloths, and organic fiber cloths. Examples of the substrate include but are not limited to woven fabrics, non-woven fabrics, glass roving cloths, glass cloths, chopped glass fibers, hollow glass fibers, glass mats, glass surfacing mats, non-woven glass fabrics, and ceramic fiber fabrics. Examples of the raw material that can be used to form the substrate include but are not limited to E-glass fiber, NE-glass fiber, S-glass fiber, L-glass fiber, T-glass fiber, D-glass fiber, quartz, aramid, and liquid crystal polymer. Considering the dielectric properties of the prepared electronic material, it is preferred to use a substrate with a low Df value, such as a substrate composed of NE-glass fiber, S-glass fiber, and L-glass fiber.

In some embodiments of the present invention, a 2116 glass fiber cloth is used as a reinforced material, i.e., the substrate. The substrate is heated and dried at 175° C. for 2 to 15 minutes (B-stage) to provide a semi-cured prepreg.

3. METAL-CLAD LAMINATE AND PRINTED CIRCUIT BOARD

The present invention also provides a metal-clad laminate prepared from the aforementioned prepreg, which comprises a dielectric layer and a metal layer. The metal-clad laminate can be prepared by laminating the aforementioned prepreg and a metal foil, or by coating the resin composition onto a metal foil and then drying the coated metal foil, wherein the dielectric layer is provided by the aforementioned prepreg. In the case of the preparation of the metal-clad laminate by using the prepreg, the metal-clad laminate can be prepared by superimposing a plurality of the aforementioned prepregs, superimposing a metal foil (such as a copper foil) on at least one external surface of the dielectric layer composed of the superimposed prepregs to provide a superimposed object, and then performing a hot-pressing operation to the superimposed object to obtain the metal-clad laminate.

Furthermore, the aforementioned metal-clad laminate can form a printed circuit board by further patterning the external metal foil thereof.

4. EXAMPLES

4.1. Testing Methods

The present invention is further illustrated by the embodiments hereinafter, wherein the testing instruments and methods are as follows:

[Dielectric Constant (Dk) and Dissipation Factor (Df) Measurements]

The dielectric constant (Dk) and dissipation factor (Df) of the dielectric layer (having a resin content (RC) of 54%) are measured according to IPC-TM-650 2.5.5.13 under an operating frequency of 10 GHz. The dielectric layer is obtained by etching and removing the metal foils from the two surfaces of the metal-clad laminate.

[Glass Transition Temperature (Tg) Test]

The glass transition temperature (Tg) of the dielectric layer is measured by using a dynamic mechanical analyzer (DMA), wherein the dielectric layer is as defined above. The instrument used is a viscoelasticity spectrometer which is DMS100 available from Seiko Instruments. The measuring method is as follows: using bending modules, setting the frequency at 10 Hz and the heating rate at 5° C./min, and measuring the dynamic viscoelasticity during heating from room temperature to 280° C. The temperature at which the maximum tanδ is measured is Tg.

[Test for the Adhesion to Copper Foils]

Adhesion to copper foils refers to the bonding strength between the copper foil and the laminated prepreg, and in this test it is expressed as the force required to vertically peel the clad copper foil with a width of ⅛ inch from the surface of the laminated prepreg. The unit of the peeling strength is pound-force per inch (lbf/in).

[Moldability Test]

A lattice pattern comprising lines with a line width of 100 μm and a line distance of 100 μm is formed on the metal-clad laminate, wherein the patterned metal-clad laminate is called the core board. The core board is then subjected to a blackening treatment. The prepreg is laminated to the core board and hot-pressed. The laminating and hot-pressing procedures are repeated two times, and thus, the test sample comprising a lattice patterned inner layer is obtained. Check whether the test sample has gaps caused by insufficient fluidity of the resin varnish. The test sample is put in boiling water for 6 hours, and then, immersed in a tin solder bath at 288° C. for 20 seconds. The immersed test sample is visually observed. If there are no gaps, expansion or measling, the moldability is good and recorded as "○". If there are gaps, expansion or measling, the moldability is poor and recorded as "x".

[Soldering Heat Resistance Test]

Soldering heat resistance refers to the heat resistance of the metal-clad laminate measured according to HS C 6481 after a pressure cooker test (PCT), and is also called soldering heat resistance after moisture absorption. The soldering heat resistance test is carried out at 288° C. Three dried metal-clad laminates are subjected to a 6 hour-PCT which is carried out at 121° C., a saturated relative humidity (100% R.H.), and a pressure of 2 atmospheres (0.2 megapascals (MPa)) for 5 hours. The metal-clad laminates having been subjected to the 6 hour-PCT are then separately immersed in tin solder baths at 288° C. for 20 seconds. The immersed metal-clad laminates are visually observed. If no measling or blistering is found, the moldability is good and recorded as "○". If measling or blistering is found, the moldability is poor and recorded as "x".

4.2. List of Raw Materials Used in Examples and Comparative Examples

TABLE 1

Raw Material List

| Raw material, Model No. | Description |
|---|---|
| SA9000 | Polyphenylene ether resin of formula (II) with unsaturated functional groups, wherein in formula (II) $A_1$ and $A_2$ are 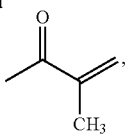, available from SABIC Company |
| OPE-2st | Polyphenylene ether resin of formula (II) having unsaturated functional groups, wherein in formula (II) $A_1$ and $A_2$ are 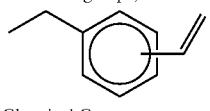, available from Mitsubishi Gas Chemical Company |
| ODV-XET-1 | Polyfunctional vinyl aromatic copolymer having a number average molecular weight (Mn) of 2400 and a vinyl equivalent of 293 g/eq, available from Nippon Steel & Sumikin Chemical Company |
| ODV-XET-2 | Polyfunctional vinyl aromatic copolymer having a Mn of 2340 and a vinyl equivalent of 265 g/eq, available from Nippon Steel & Sumikin Chemical Company |
| ODV-XET-3 | Polyfunctional vinyl aromatic copolymer having a Mn of 2820 and a vinyl equivalent of 207 g/eq, available from Nippon Steel & Sumikin Chemical Company |
| BMI-5100 | Crosslinking agent, maleimide-based compound, available from Daiwa Fine Chemical Company |
| SPV-100 | Allyl cyclophosphazene compound of formula (I-1), available from Otsuka Chemical Company, |
| SPB-100 | Cyclophosphazene compound having a structure not consistent with formula (I), available from Otsuka Chemical Company |
| OP935 | Diethylphosphinate available from CLARIANT Company |
| SC-5500 SVC | Silica filler surface-modified with vinyl silane, available from Admatechs Company, average particle diameter being 1.5 μm |
| Perbutyl P | Polymerization initiator, available from Nippon Oil & Fats Company |

4.3. Preparation of the Resin Composition

The resin compositions of Examples 1-11 and Comparative Examples 1-5 were prepared according to the proportions shown in Tables 2-1~2-3. The components were mixed at room temperature by a stirrer. Toluene, methyl ethyl ketone and γ-butyrolactone (all available from Fluka company) were added as solvents. The resultant mixture were stirred at room temperature for 60~120 minutes to obtain the resin compositions.

TABLE 2-1

Compositions of the resin compositions of Examples 1~6

| | | Example | | | | | |
|---|---|---|---|---|---|---|---|
| Unit: parts by weight | | 1 | 2 | 3 | 4 | 5 | 6 |
| Polyphenylene ether resin (a1) | SA9000 | 50 | 50 | 50 | 25 | 25 | 25 |
| | OPE-2st | | | | 25 | 25 | 25 |
| Polyfunctional vinyl aromatic copolymer (a2) | ODV-XET-1 | 50 | | | | | |
| | ODV-XET-2 | | 50 | | | | |
| | ODV-XET-3 | | | 50 | 50 | 50 | 50 |
| Allyl cyclophosphazene compound (B) | SPV-100 | 30 | 30 | 30 | 30 | 20 | 10 |
| Filler | SC-5500 SVC | 70 | 70 | 70 | 70 | 70 | 70 |
| Polymerization initiator | Perbutyl P | 1 | 1 | 1 | 1 | 1 | 1 |

TABLE 2-2

Compositions of the resin compositions of Examples 7~11

| | | Example | | | | |
|---|---|---|---|---|---|---|
| Unit: parts by weight | | 7 | 8 | 9 | 10 | 11 |
| Polyphenylene ether resin (a1) | SA9000 | 40 | 15 | 20 | 15 | 15 |
| | OPE-2st | 45 | 20 | 25 | 25 | 20 |
| Polyfunctional vinyl aromatic copolymer (a2) | ODV-XET-1 | | | | | |
| | ODV-XET-2 | | | | | |
| | ODV-XET-3 | 15 | 65 | 50 | 50 | 50 |
| Crosslinking agent (a3) | BMI-5100 | | | 5 | 10 | 15 |
| Allyl cyclophosphazene compound (B) | SPV-100 | 30 | 30 | 30 | 30 | 55 |
| Filler | SC-5500 SVC | 70 | 70 | 70 | 70 | 70 |
| Polymerization initiator | Perbutyl P | 1 | 1 | 1 | 1 | 1 |

TABLE 2-3

Compositions of the resin compositions of Comparative Examples 1~5

| Unit: parts by weight | | Comparative Example | | | | |
|---|---|---|---|---|---|---|
| | | 1 | 2 | 3 | 4 | 5 |
| Polyphenylene ether resin (a1) | SA9000 | 25 | 25 | | 100 | 25 |
| | OPE-2st | 25 | 25 | | | 25 |
| Polyfunctional vinyl aromatic copolymer (a2) | ODV-XET-1 | 50 | 50 | 100 | | |
| | ODV-XET-2 | | | | | |
| | ODV-XET-3 | | | | | 50 |
| Allyl cyclophosphazene compound (B) | SPV-100 | | | 30 | 30 | 4 |
| Other flame retardant having a structure not consistent with formula (I) | SPB-100 | 30 | | | | |
| | OP935 | | 15 | | | |
| Filler | SC-5500 SVC | 70 | 70 | 70 | 70 | 70 |
| Polymerization initiator | Perbutyl P | 1 | 1 | 1 | 1 | 1 |

4.4. Preparation and Property Measurements of the Metal-Clad Laminates

Prepregs and metal-clad laminates were prepared respectively by using the resin compositions of Examples 1 to 11 and Comparative Examples 1 to 5. First, glass fiber cloths (Model No.: 2116; thickness: 0.08 mm) were immersed in the resin compositions of Examples 1 to 11 and Comparative Examples 1 to 5 respectively through roll coaters, and the thicknesses of the glass fiber cloths were controlled to a proper extent. The immersed glass fiber cloths were then placed in an oven and heated and dried at 175° C. for 2 to 15 minutes to produce prepregs in a half-cured state (B-stage) (the resin content of the prepreg was 54%). Four pieces of the prepregs were superimposed, and two sheets of copper foils (each 0.5 oz.) were superimposed respectively on both of the two external surfaces of the superimposed prepregs. A hot-pressing operation was performed on each of the prepared objects. The hot-pressing conditions were as follows: heating to 200° C.-220° C. at a heating rate of 3.0° C./min, and hot-pressing at said temperature for 180 minutes under a full pressure of 15 kg/cm² (initial pressure was 8 kg/cm²).

The properties of the prepregs and metal-clad laminates of Examples 1 to 11 and Comparative Examples 1 to 5, including Df, Dk, Tg, adhesion to copper foils, moldability and soldering heat resistance, were measured according to the aforementioned testing methods, and the results are listed in Tables 3 and 4.

TABLE 3

Properties of the prepregs and metal-clad laminates in the Examples

| unit | | Tg °C. | adhesion to copper foils lbf/inch | Dk @ 10 GHz | Df @ 10 GHz | moldability | soldering heat resistance |
|---|---|---|---|---|---|---|---|
| Example | 1 | 203 | 3.2 | 3.9 | 0.0041 | ○ | ○ |
| | 2 | 204 | 3.1 | 3.9 | 0.0040 | ○ | ○ |
| | 3 | 205 | 3.2 | 3.9 | 0.0041 | ○ | ○ |
| | 4 | 213 | 3.2 | 3.9 | 0.0040 | ○ | ○ |
| | 5 | 213 | 3.1 | 3.8 | 0.0039 | ○ | ○ |
| | 6 | 215 | 3.2 | 3.8 | 0.0037 | ○ | ○ |
| | 7 | 208 | 3.4 | 3.9 | 0.0048 | ○ | ○ |
| | 8 | 204 | 3.0 | 3.8 | 0.0037 | ○ | ○ |
| | 9 | 219 | 3.8 | 3.9 | 0.0041 | ○ | ○ |
| | 10 | 223 | 3.9 | 3.9 | 0.0043 | ○ | ○ |
| | 11 | 202 | 3.6 | 4.0 | 0.0049 | ○ | ○ |

TABLE 4 properties of the prepregs and metal-clad laminates in the Comparative Examples

| unit | | Tg °C. | adhesion to copper foils lbf/inch | Dk @ 10 GHz | Df @ 10 GHz | moldability | soldering heat resistance |
|---|---|---|---|---|---|---|---|
| Comparative Example | 1 | 194 | 3.2 | 3.9 | 0.0041 | ○ | × |
| | 2 | 221 | 2.1 | 3.9 | 0.0043 | × | ○ |
| | 3 | 189 | 2.0 | 3.8 | 0.0034 | ○ | × |
| | 4 | 195 | 2.5 | 4.0 | 0.0050 | ○ | × |
| | 5 | 215 | 2.6 | 3.8 | 0.0036 | × | ○ |

As shown in Table 3, each of the electronic materials prepared from the halogen-free low dielectric resin composition of the present invention exhibits satisfactory physicochemical properties and dielectric properties (e.g., Dk, Df, Tg, adhesion to copper foils, and so on), and has excellent dimensional stability and soldering heat resistance. Specifically, as shown in Examples 1 to 3 and 4 to 6, when the resin composition of the present invention comprises two different polyphenylene ether resins, the Tg of the prepared electronic material can be further improved. As shown in Examples 9 to 11, when the resin composition of the present invention further comprises an unsaturated functional group-containing crosslinking agent (e.g., bismaleimide), the prepared electronic materials exhibit further improved adhesion to copper foils. As shown in Examples 7 and 8, when in resin composition, the weight ratio (a1:a2) of the polyphenylene ether resin (a1) with unsaturated functional groups to the polyfunctional vinyl aromatic copolymer (a2) falls within the range specified in the present invention, the prepared electronic materials all achieve satisfactory physicochemical properties and dielectric properties, and possess excellent moldability and soldering heat resistance. As shown in Examples 6 and 11, when in the resin composition, the content of the allyl cyclophosphazene compound of formula (I) falls within the range specified in the present invention, and no matter whether the content is low or high, the prepared electronic materials all achieve satisfactory physicochemical properties and dielectric properties, and possess excellent moldability and soldering heat resistance.

In contrast, as shown in Table 4, the electronic materials prepared by using resin compositions other than the halogen-free low dielectric resin composition of the present invention do not achieve satisfactory performance for all physicochemical properties and dielectric properties, and do not have good moldability and soldering heat resistance, thus they cannot provide the effects achieved in the present invention. Specifically, as shown in Comparative Examples 1 and 2, when the resin composition comprises the polyphenylene ether resin and the polyfunctional vinyl aromatic copolymer but does not comprise the allyl cyclophosphazene compound of formula (I), even if other phosphorus-containing flame retardants are added therein, the prepared electronic materials still do not simultaneously exhibit satisfactory physicochemical properties and dielectric properties, and possess good moldability and soldering heat resistance, thus they cannot provide the effects achieved in the present invention. As shown in Comparative Examples 3 and 4, when the resin composition does not simultaneously comprise the polyphenylene ether resin and the polyfunctional vinyl aromatic copolymer, the prepared electronic materials still do not simultaneously exhibit satisfactory physicochemical properties and dielectric properties, and possess good moldability and soldering heat resistance, thus they cannot provide the effects achieved in the present invention. As shown in Comparative Example 5, if the content of the allyl cyclophosphazene compound of formula (I) does not fall within the range specified in the present invention, for example, being lower than 5 parts by weight, based on 100 parts by weight of the resin system (A), then the prepared electronic materials also do not have good adhesion to copper foils and good moldability, thus, they do not provide the effects achieved in the present invention. The above experimental results fully demonstrate that unexpected effects actually can be provided by the resin composition of the present invention comprising specific components in specific proportions.

The above examples are used to illustrate the principle and efficacy of the present invention and show the inventive features thereof, but are not used to limit the scope of the present invention. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A halogen-free low dielectric resin composition, comprising:
   (A) a resin system, which includes:
      (a1) a polyphenylene ether resin with unsaturated functional groups; and
      (a2) a polyfunctional vinyl aromatic copolymer; and
   (B) an allyl cyclophosphazene compound represented by the following formula (I):

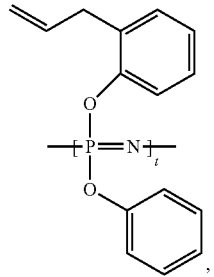

formula (I)

in formula (I), t is an integer ranging from 2 to 6,
wherein, the polyfunctional vinyl aromatic copolymer (a2) is prepared by copolymerizing one or more divinyl aromatic compounds and one or more monovinyl aromatic compounds,
wherein the polyfunctional vinyl aromatic copolymer (a2) comprises the following structural units:

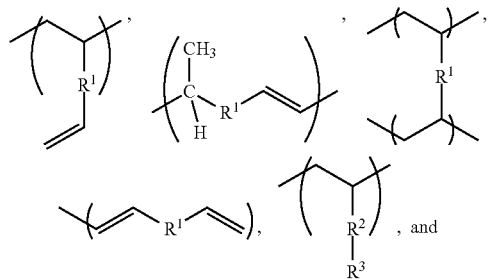

-continued

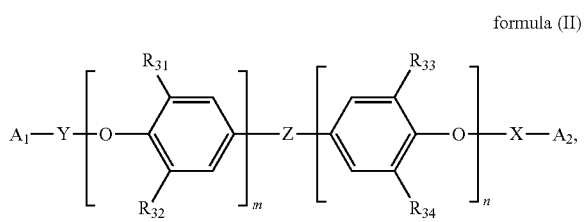

wherein, $R^1$ and $R^2$ are independently a C6-C12 aromatic hydrocarbyl, $R^3$ is H or a C1-C12 hydrocarbyl, and
wherein the weight ratio of the polyphenylene ether resin (a1) with unsaturated functional groups to the polyfunctional vinyl aromatic copolymer (a2) is 9:1 to 3:7, and wherein the allyl cyclophosphazene compound (B) is in an amount ranging from 5 parts by weight to 60 parts by weight based on 100 parts by weight of the resin system (A).

2. The resin composition of claim 1, wherein the polyphenylene ether resin (a1) with unsaturated functional groups comprises one or more polyphenylene ether resins represented by the following formula (II):

formula (II)

$$A_1\text{—}Y\text{—}\left[\text{O}\begin{array}{c}R_{31}\\ \\R_{32}\end{array}\right]_m\text{—}Z\text{—}\left[\begin{array}{c}R_{33}\\ \\R_{34}\end{array}\text{O}\right]_n\text{—}X\text{—}A_2$$

in formula (II),
$R_{31}$, $R_{32}$, $R_{33}$ and $R_{34}$ are independently H, or a substituted or unsubstituted C1-C5 alkyl; m and n are independently an integer from 0 to 100, with the proviso that m and n are not 0 at the same time;
X and Y are independently absent, or carbonyl or an alkenyl-containing group;

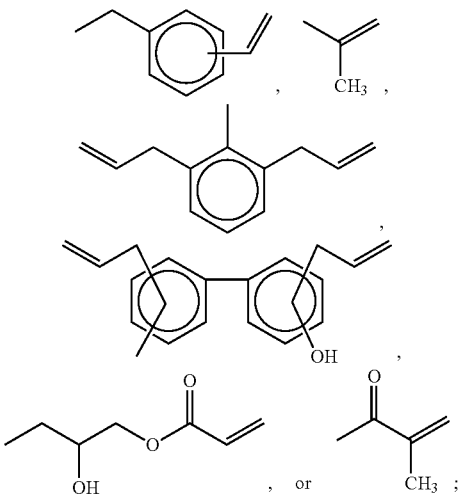

$A_1$ and $A_2$ are independently and

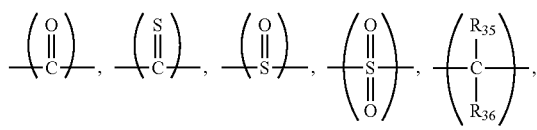

Z is absent, —O—, or aryl, wherein $R_{35}$ and $R_{36}$ are independently H or a C1-C12 alkyl.

3. The resin composition of claim 2, wherein the polyphenylene ether resin (a1) with unsaturated functional groups comprises at least two polyphenylene ether resins represented by formula (II), wherein $A_1$ and $A_2$ are independently

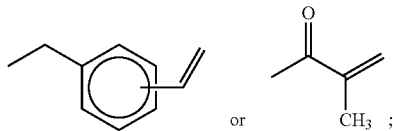

Z is aryl or

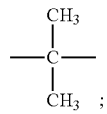

X and Y are absent; $R_{31}$, $R_{32}$, $R_{33}$ and $R_{34}$ are methyl; and $20<(m+n)<25$.

4. The resin composition of claim 1, wherein the divinyl aromatic compound is slected from the group consisting of divinylbenzene, divinylnaphthalene, divinylbiphenyl and isomers thereof.

5. The resin composition of claim 1, wherein the monovinyl aromatic compound is slected from the group consisting of a nuclear-alkyl-substituted vinyl aromatic compound, α-alkyl-substituted vinyl aromatic compound, (β-alkyl-substituted vinyl aromatic compound, and alkoxyl-substituted vinyl aromatic compound.

6. The resin composition of claim 1, wherein the resin system (A) futher comprises:
(a3) an unsaturated functional group-containing crosslinking agent.

7. The resin composition of claim 6, wherein the unsaturated functional group-containing crosslinking agent (a3) is selected from the group consisting of a polyfunctional allylic compound, a polyfunctional acrylate, a polyfunctional acrylamide, a polyfunctional styrenic compound, a bismaleimide compound, and combinations thereof.

8. The resin composition of claim 6, wherein the unsaturated functional group-containing crosslinking agent (a3) is in an amount ranging from 1 part by weight to 20 parts by weight based on 100 parts by weight of the resin system (A).

9. The resin composition of claim 7, wherein the unsaturated functional group-containing crosslinking agent (a3) is in an amount ranging from 1 part by weight to 20 parts by weight based on 100 parts by weight of the resin system (A).

10. The resin composition of claim 1, wherein the allyl cyclophosphazene compound (B) is represented by the following formula (I-1):

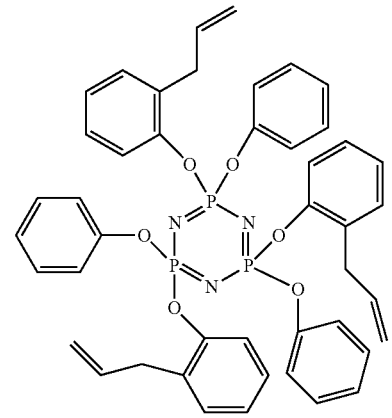

formula (I-1)

11. The resin composition of claim 1, further comprising a filler selected from the group consisting of silica, aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

12. A prepreg, which is prepared by impregnating a substrate with the resin composition of claim 1 or by coating said resin composition onto a substrate and drying the impregnated or coated substrate.

13. A metal-clad laminate, which is prepared by laminating the prepreg of claim 12 and a metal foil.

14. A printed circuit board, which is prepared from the metal-clad laminate of claim 13.

15. A metal-clad laminate, which is prepared by coating the resin composition of claim 1 onto a metal foil and drying the coated metal foil.

16. A printed circuit board, which is prepared from the metal-clad laminate of claim 15.

* * * * *